United States Patent
Ozyilmaz et al.

(10) Patent No.: US 8,659,009 B2
(45) Date of Patent: Feb. 25, 2014

(54) LOCALLY GATED GRAPHENE NANOSTRUCTURES AND METHODS OF MAKING AND USING

(75) Inventors: Barbaros Ozyilmaz, Singapore (SG); Dmitri Efetov, New York, NY (US); Pablo Jarillo-Herrero, Cambridge, MA (US); Philip Kim, New York, NY (US)

(73) Assignee: The Trustees of Columbia University in the City of New York, New York, NY (US)

( * ) Notice: Subject to any disclaimer, the term of this patent is extended or adjusted under 35 U.S.C. 154(b) by 758 days.

(21) Appl. No.: 12/290,648

(22) Filed: Oct. 31, 2008

(65) Prior Publication Data
US 2009/0140801 A1 Jun. 4, 2009

Related U.S. Application Data

(60) Provisional application No. 61/002,684, filed on Nov. 9, 2007, provisional application No. 61/002,880, filed on Nov. 13, 2007, provisional application No. 61/001,532, filed on Nov. 2, 2007.

(51) Int. Cl.
*H01L 29/08* (2006.01)
(52) U.S. Cl.
USPC .................. 257/40; 257/9; 438/99; 977/742
(58) Field of Classification Search
USPC ............... 257/9, 29, 613, E29.168, E29.176, 257/E29.297, 40; 438/197, 99; 977/840, 977/936, 938, 742
See application file for complete search history.

(56) References Cited

U.S. PATENT DOCUMENTS

| | | | |
|---|---|---|---|
| 2007/0014151 A1* | 1/2007 | Zhang et al. | 365/185.01 |
| 2007/0032091 A1* | 2/2007 | Heald et al. | 438/758 |
| 2007/0187694 A1* | 8/2007 | Pfeiffer | 257/76 |

OTHER PUBLICATIONS

Ozyilmaz, B., et al. "Electronic Transport and Quantum Hall Effect in Bipolar Graphene p-n-p Junctions." Phys. Rev. Lett., vol. 99 (2007): Article 166804, pp. 1-4.*
Obradovic, B., et al. "Analysis of Graphene Nanoribbons as a Channel Material for Field-Effect Transistors." Appl. Phys. Lett., vol. 88 (2006): Article 142102, pp. 1-3.*
Yoon, Y. & Guo, J. "Effect of Edge Roughness in Graphene Nanoribbon Transistors." Appl. Phys. Lett., vol. 91 (2007): Article 073103, pp. 1-3.*
Fiori, G. & iannaccone, G. "Sumulation of Graphene Nanoribbon Field-Effect Transistors." IEEE Elect. Dev. Lett., vol. 28 (2007): pp. 760-762.*

(Continued)

*Primary Examiner* — Mark Tornow
(74) *Attorney, Agent, or Firm* — Schwegman, Lundberg & Woessner, P.A.

(57) ABSTRACT

A locally gated graphene nanostructure is described, along with methods of making and using the same. A graphene layer can include first and second terminal regions separated by a substantially single layer gated graphene nanoconstriction. A local first gate region can be separated from the graphene nanoconstriction by a first gate dielectric. The local first gate region can be capacitively coupled to gate electrical conduction in the graphene nanoconstriction. A second gate region can be separated from the graphene nanoconstriction by a second gate dielectric. The second gate region can be capacitively coupled to provide a bias to a first location in the graphene nanoconstriction and to a second location outside of the graphene nanoconstriction. Methods of making and using locally gated graphene nanostructures are also described.

25 Claims, 6 Drawing Sheets
(6 of 6 Drawing Sheet(s) Filed in Color)

(56) References Cited

OTHER PUBLICATIONS

Lemme, M.C., et al. "A Graphene Field-Effect Device." IEEE Elect. Dev. Lett., vol. 28 (2007): pp. 282-284.*

Liang, G., et al. "Ballistic Graphene Nanoribbon Metal-Oxide-Semiconductor Field-Effect Transistors: A Full Real-Space Quantum Transport Simulation." J. Appl. Phys., vol. 102 (2007): Article 054307, pp. 1-7.*

Echtermeyer, T.J., et al. "Graphene Field-Effect Devices." Eur. Phys. J. Spec. Top., vol. 148 (2007): pp. 19-25.*

Lin, Y.-M., et al. "High-Performance Carbon Nanotube Field-Effect Transistor With Tunable Polarities." IEEE. Trans. Nanotech., vol. 4 (2005): pp. 481-489.*

Huard, B., et al. "Transport Measurements Across a Tunable Potential Barrier in Graphene." Phys. Rev. Lett., vol. 98 (2007): Article 236803, pp. 1-4.*

Yan, Q., et al. "Intrinsic Current-Voltage Characteristics of Graphene Nanoribbon Transistors and Effect of Edge Doping." Nanolett., vol. 7 (2007): pp. 1469-1473.*

Liang, G., et al. "Performance Projections for Ballistic Graphene Nanoribbon Field-Effect Transistors." IEEE Trans. Elect. Dev., vol. 54 (Apr. 4, 2007): pp. 677-682.*

Han, M.Y., et al. "Energy Band-Gap Engineering of Graphene Nanoribbons." Phys. Rev. Lett., vol. 98 (May 18, 2007): Article 206805, pp. 1-4.*

Han, M., et al. "Electronic Transport Measurements in Graphene Nanoribbons." Phys. Stat. Sol. (b), vol. 244 (Oct. 2, 2007): pp. 4134-4137.*

Quirk, Michael, and Julian Serda. Semiconductor Manufacturing Technology. Upper Saddle River, NJ: Prentice Hall, 2001, pp. 339-340.*

Chen, Z., et al., "Graphene Nano-Ribbon Electronics", Physica E, 40(2), (Dec. 2007), 228-232.

Williams, J. R., et al., "Quantum Hall effect in a gate-controlled p-n junction of graphene", Science, 317(5838), (Aug. 3, 2007), 638-41.

* cited by examiner

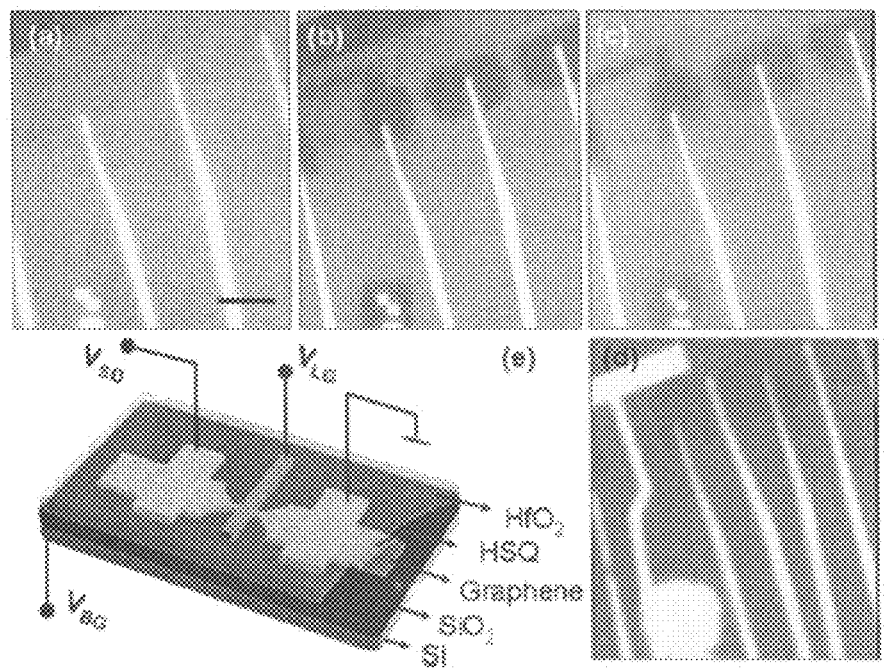
FIGS. 1(a), 1(b), 1(c), 1(d), and 1(e)
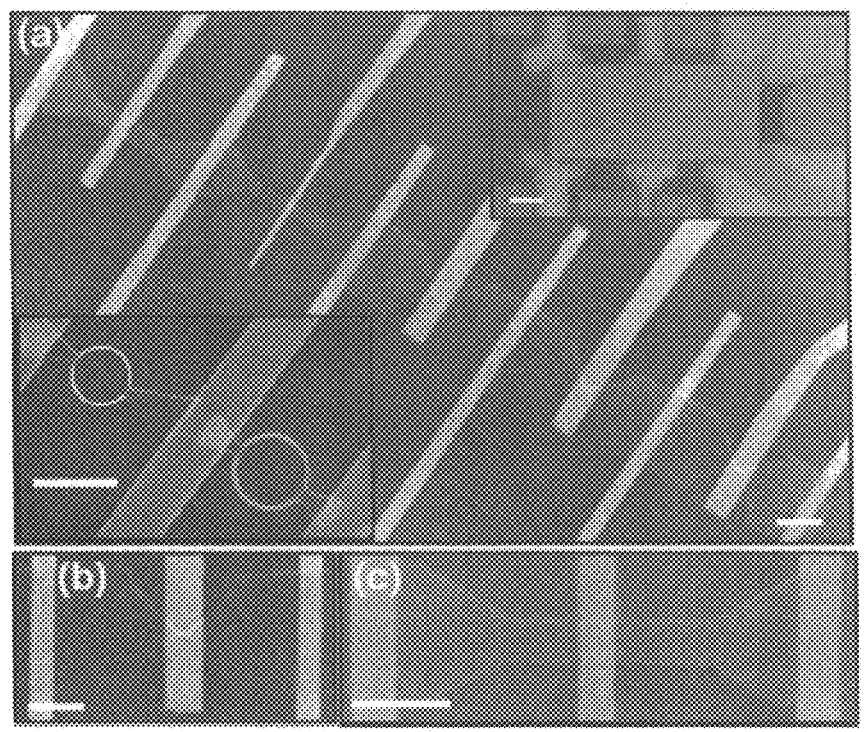
FIGS. 2(a), 2(b), and 2(c)

FIGS. 3(a), 3(b), 3(c), and 3(d)

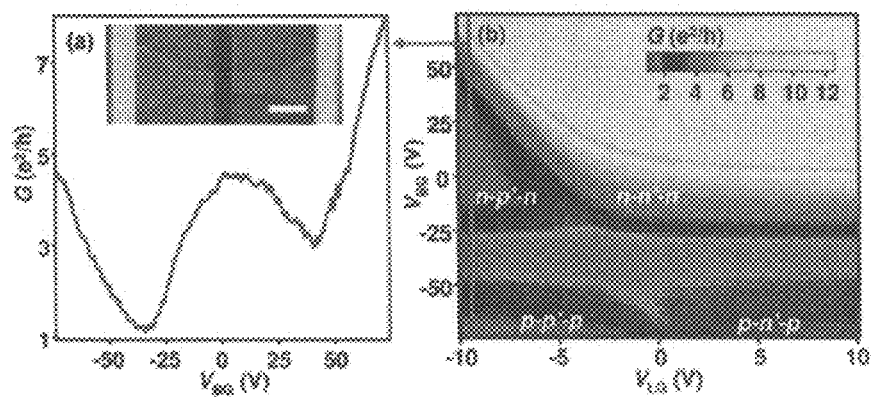
FIGS. 5(a) and 5(b)
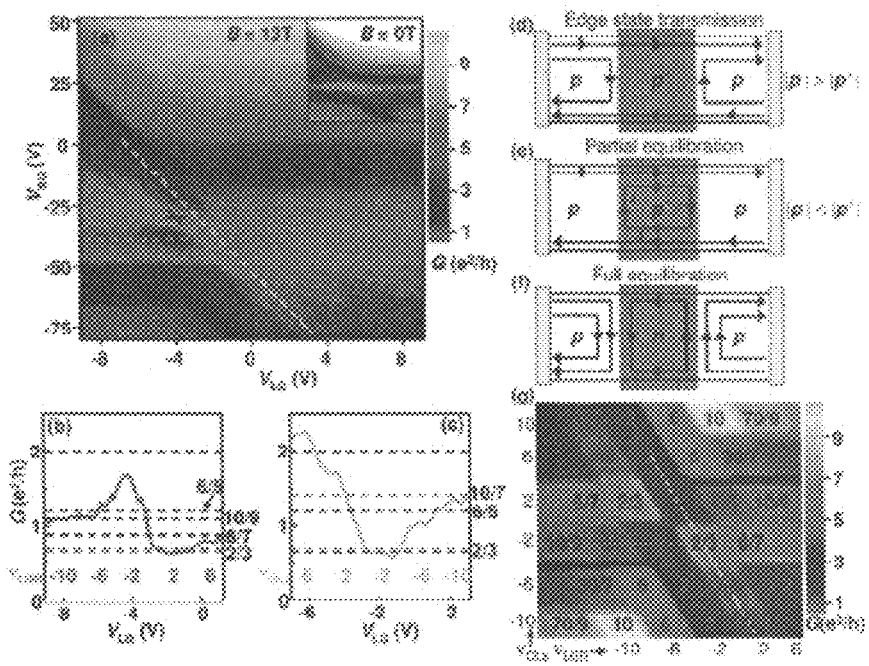
FIGS. 6(a), 6(b), 6(c), 6(d), 6(e), 6(f), and 6(g)

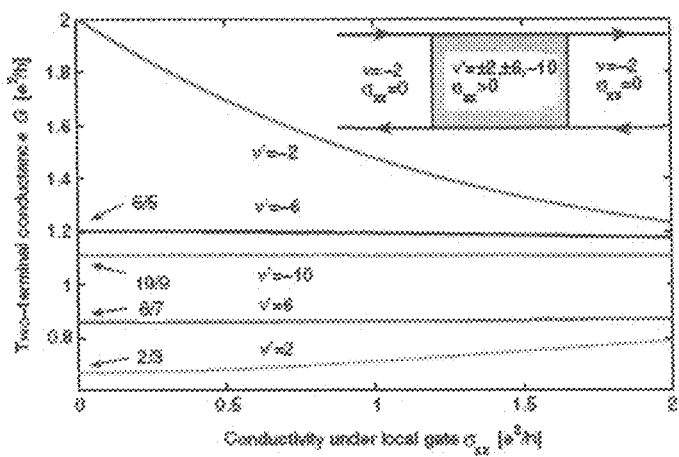
FIG. 7
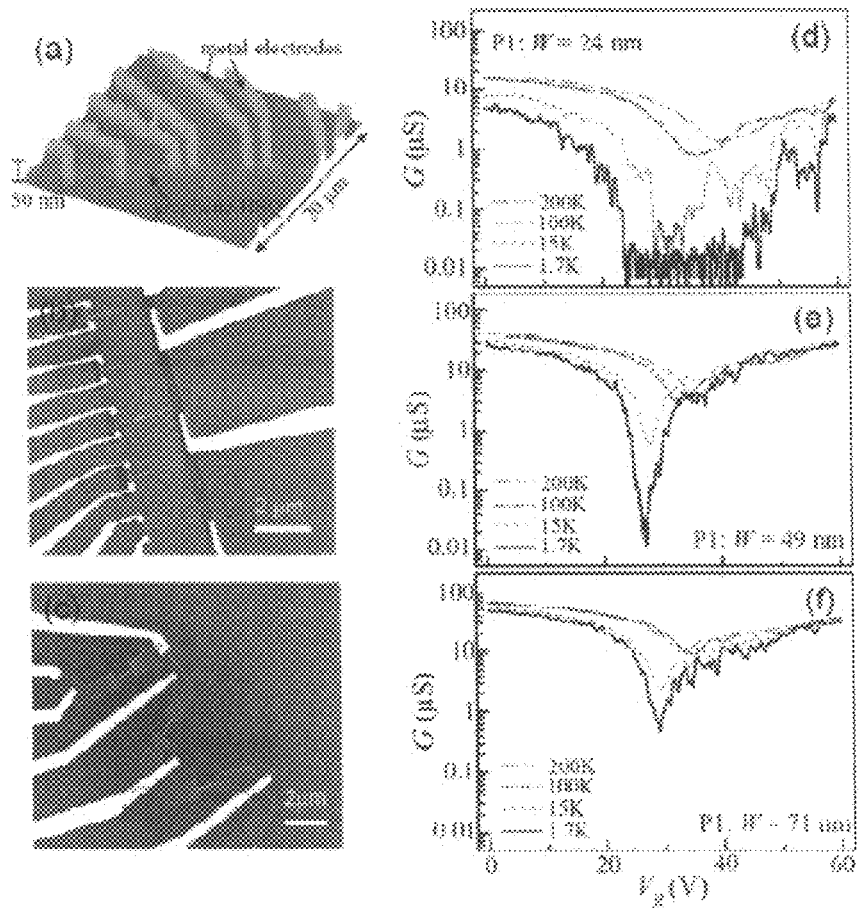
FIGS. 8(a), 8(b), 8(c), 8(d), 8(e), and 8(f)

LOCALLY GATED GRAPHENE NANOSTRUCTURES AND METHODS OF MAKING AND USING

CLAIM OF PRIORITY

This patent application claims the benefit of priority, under 35 U.S.C. Section 119(e), to:

(1) Barbaros Oezyilmaz, Dmitri Efetov, Pablo Jarillo-Herrero, and Philip Kim U.S. Provisional Patent Application No. 61/002,684 entitled ELECTRONIC TRANSPORT IN LOCALLY GATED GRAPHENE NANOCONSTRICTIONS, filed on Nov. 9, 2007, which is incorporated by reference herein;

(2) Barbaros Oezyilmaz, Dmitri Efetov, Pablo Jarillo-Herrero, and Philip Kim U.S. Provisional Patent Application No. 61/002,880 entitled ELECTRONIC TRANSPORT AND QUANTUM HALL EFFECT IN BIPOLAR GRAPHENE P-N-P JUNCTIONS, filed on Nov. 13, 2007, which is incorporated by reference herein; and (3) Melinda Y. Han and Philip Kim U.S. Provisional Patent Application No. 61/001,532 entitled ENERGY BAND GAP ENGINEERING OF GRAPHENE NANORIBBONS, filed on Nov. 2, 2007, which is incorporated by reference herein.

STATEMENT REGARDING FEDERALLY SPONSORED RESEARCH OR DEVELOPMENT

This invention was made with government support by the ONR (N000150610138), FENA, DOE (DE-FG02-05ER46215), NSF CAREER (DMR-0349232), and NSEC (CHE-0117752), and the New York State Office of Science, Technology, and Academic Research (NYSTAR). The government has certain rights in this invention.

TECHNICAL FIELD

This document pertains generally to electronic devices and their fabrication and use, and more particularly, but not by way of limitation, to a locally gated graphene nanostructure, and methods of making and using the same.

BACKGROUND

Graphene constitutes a single sheet of graphite. It can be an exceptional candidate for nanoscale electronic applications. It can have charge carrier mobility as high as 20,000 cm$^2$/V·s. This can allow ballistic transport, such as on the 100 nm scale, even at room temperature.

OVERVIEW

This document describes, among other things, a locally gated graphene nanostructure electronic device, and methods of making and using the same. We have developed, among other things, a combination of an etching and deposition technique that enables the fabrication of locally gated graphene nanostructures of arbitrary design. Employing this method, we can fabricate graphene nanoconstrictions with local tunable transmission and characterize their electronic properties. An order of magnitude enhanced gate efficiency is achieved adopting the local gate geometry with thin dielectric gate oxide. A complete turning off of the device is demonstrated as a function of the local gate voltage. Such strong suppression of device conductance was found to be due to both quantum confinement and Coulomb blockade effects in the constricted graphene nanostructures. In this document, we describe a process that permits combining both the patterning of graphene sheets into any desired planar nanostructure and the local gating of the latter. Besides the abovementioned phenomena, this approach can also be used for the fabrication of large arrays of like graphene devices from wafer grown epitaxial graphene, where a global back-gate can be absent and local gating can be used modulate the carrier density. The locally-gated device can use a specified channel width to define an energy bandgap, such as in a locally-gated channel region.

Example 1 describes an electronic device. In this example, the device can include a graphene layer comprising first and second terminal regions separated by a substantially single layer gated graphene nanoconstriction. A local first gate region can be separated from the graphene nanoconstriction by a first gate dielectric. The local first gate region can be configured to be capacitively coupled to gate electrical conduction in the graphene nanoconstriction. A second gate region can be separated from the graphene nanoconstriction by a second gate dielectric. The second gate region can be configured to be capacitively coupled to provide a bias to a first location in the graphene nanoconstriction and to a second location outside of the graphene nanoconstriction.

In Example 2, the device of Example 1 can optionally comprise a gated channel length between the first and second terminal regions. The device can define a gated channel width substantially orthogonal to the channel length. In an example, the channel width is less than 100 nanometers.

In Example 3, the device of one or more of Examples 1-2 optionally comprises a channel width that is less than 30 nanometers.

In Example 4, the device of one or more of Examples 1-3 optionally is configured such that the graphene nanoconstriction comprises a gated channel length between the first and second terminal regions. The device can define a gated channel width substantially orthogonal to the channel length. The channel width can be selected to provide an energy bandgap in the graphene nanoconstriction of at least 2 meV.

In Example 5, the device of one or more of Examples 1-4 can be optionally configured such that the channel width is selected to provide an energy bandgap in the graphene nanoconstriction of at least 10 meV.

In Example 6, the device of one or more of Examples 1-5 can be optionally configured such that the channel width is selected to provide an energy bandgap in the graphene nanoconstriction of at least 100 meV.

In Example 7, the device of one or more of Examples 1-6 can be optionally configured such that the graphene nanoconstriction comprises a gated channel length between the first and second terminal regions, and defines a gated channel width substantially orthogonal to the channel length, and wherein the channel width is selected to provide a change of conductance of at least about $10^3 \cdot e^2/h$, in response to a change in gate voltage between the first and second gates of about 4 Volts.

In Example 8, the device of one or more of Examples 1-7 can optionally comprise a transistor that comprises the first and second terminal regions and the first gate region, and wherein the first gate dielectric comprises a first layer comprising hydrogen silsesquixane (HSQ) and a second layer comprising a dielectric material having a dielectric constant $k \geq 20$.

In Example 9, the device of one or more of Examples 1-8 can optionally be configured such that the second gate comprises a silicon substrate providing a global back gate for the graphene layer, and wherein the second dielectric comprises silicon dioxide.

In Example 10, the device of one or more of Examples 1-9 can optionally be configured such that the local first gate region provides a local first capacitance to the graphene nanoconstriction, and wherein the second gate region provides a second capacitance to the graphene nanoconstriction, and wherein a ratio of the local first capacitance to the second capacitance is about 10.5.

Example 11 describes a method. In this example, the method can comprise using a graphene layer comprising first and second terminal regions separated by a substantially single layer graphene nanoconstriction. A bias voltage can be capacitively coupled to the graphene layer. The graphene nanoconstriction can be locally gated to locally control electrical conduction between the first and second terminal regions.

In Example 12, the method of Example 11 can optionally be performed such that the locally gating the graphene nanoconstriction comprises locally gating the graphene nanoconstriction having a gated channel width that is less than 100 nanometers.

In Example 13, the method of one or more of Examples 11-12 can optionally be performed such that the locally gating the graphene nanoconstriction comprises locally gating the graphene nanoconstriction having a gated channel width that is less than 30 nanometers.

In Example 14, the method of one or more of Examples 11-13 can optionally be performed such that the locally gating the graphene nanoconstriction comprises locally gating the graphene nanoconstriction having an energy bandgap in the graphene nanoconstriction of at least 2 meV.

In Example 15, the method of one or more of Examples 11-14 can optionally be performed such that the locally gating the graphene nanoconstriction comprises locally gating the graphene nanoconstriction having an energy bandgap in the graphene nanoconstriction of at least 10 meV.

In Example 16, the method of one or more of Examples 11-15 can optionally be performed such that the locally gating the graphene nanoconstriction comprises locally gating the graphene nanoconstriction having an energy bandgap in the graphene nanoconstriction of at least 100 meV.

In Example 17, the method of one or more of Examples 11-16 can optionally be performed such that the locally gating the graphene nanoconstriction comprises locally gating the graphene nanoconstriction to provide a gate-controlled p-n junction between the first and second terminal regions.

In Example 18, the method of one or more of Examples 11-17 can optionally be performed such that the locally gating the graphene nanoconstriction comprises locally gating the graphene nanoconstriction to provide a change of conductance of about $10^3 \cdot e^2/h$, in response to a change in gate voltage of about 4 Volts.

In Example 19, the method of one or more of Examples 11-18 can optionally be performed such that the locally gating the graphene nanoconstriction comprises locally capacitively coupling using a local capacitance that is about 10.5 times a capacitance used for capacitively coupling the bias voltage to the graphene layer.

Example 20 describes a method. In this example, the method can include forming a substantially single layer graphene layer. A graphene nanoconstriction can also be formed in the substantially single layer graphene layer. A local first gate can be formed, such that the local first gate can be locally capacitively coupled to the graphene nanoconstriction. A second gate can be formed, such that the second gate is capacitively coupled to the graphene layer so as to be capable of providing a bias to a first location in the graphene nanoconstriction and to a second location outside of the graphene nanoconstriction.

In Example 21, the method of Example 20 can optionally be performed such that forming the graphene nanoconstriction in the substantially single layer graphene layer comprises defining a channel width that is less than 100 nanometers.

In Example 22, the method of one or more of Examples 20-21 can optionally be performed such that forming the graphene nanoconstriction in the substantially single layer graphene layer comprises defining a channel width that is less than 30 nanometers.

In Example 23, the method of one or more of Examples 20-22 can optionally be performed such that forming the graphene nanoconstriction in the substantially single layer graphene layer comprises defining a channel width that provides an energy bandgap in the graphene nanoconstriction of at least 2 meV.

In Example 24, the method of one or more of Examples 20-23 can optionally be performed such that forming the graphene nanoconstriction in the substantially single layer graphene layer comprises defining a channel width that provides an energy bandgap in the graphene nanoconstriction of at least 10 meV.

In Example 25, the method of one or more of Examples 20-24 can optionally be performed such that forming the graphene nanoconstriction in the substantially single layer graphene layer comprises defining a channel width that provides an energy bandgap in the graphene nanoconstriction of at least 100 meV.

In Example 26, the method of one or more of Examples 20-25 can optionally be performed such that forming the graphene nanoconstriction in the substantially single layer graphene layer comprises defining a channel width such that the graphene nanoconstriction is capable of providing a change of conductance of about $10^3 \cdot e^2/h$, in response to a change in gate voltage of about 4 Volts.

In Example 27, the method of one or more of Examples 20-26 can optionally comprise forming a first dielectric between the first gate and the graphene nanoconstriction, which can include forming a first layer comprising hydrogen silsesquixane (HSQ), and forming a second layer comprising a dielectric material having a dielectric constant $k \geq 20$.

In Example 28, the method of one or more of Examples 20-27 can optionally comprise forming a silicon oxide layer on a silicon substrate, providing the graphene layer on the silicon oxide layer, forming a hydrogen silsesquioxane (HSQ) layer on the graphene layer, selectively removing portions of the HSQ layer and corresponding portions of the underlying graphene layer to define the graphene nanoconstriction, forming a high-k dielectric layer, having a dielectric constant $k \geq 20$, on the HSQ layer, and forming a gate region on the high-k dielectric layer.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

FIGS. 1(a), 1(b), 1(c), 1(d), and 1(e) show an example of a device fabrication and measurement scheme.

FIG. 1(a) shows an example of an optical microscope image of a graphene sample contacted by several electrodes. The scale bar represents 5 μm.

FIG. 1(b) shows an example of the same device as shown in FIG. 1(a) after HSQ patterning to produce a structure of bars and constrictions visible on top of graphene.

FIG. 1(c) shows an example in which, after etching in oxygen plasma, graphene can be etched away everywhere except under the HSQ, which can serve as a protective mask.

FIG. 1(d) is a picture that shows an example of several complete two-probe devices after oxygen plasma etching, ALD, and local gate patterning. In this example, the metal electrodes contact the widest part of the structure. The local gates cover the graphene constrictions and part of a graphene bar (left), in this example.

FIG. 1(e) shows a schematic view of an example of our devices. In this example, graphene can be contacted by source (S) and drain (D) electrodes, and separated from the back gate plane, such as by 300 nm $SiO_2$, and from the local gate by a top dielectric (e.g., HSQ+ALD hafnium oxide). In this example, the back gate (with voltage $V_{BG}$) can be coupled to the entire graphene structure, while the local gate can be coupled to only part of the structure.

FIGS. 2(a), 2(b), and 2(c) show examples of scanning electron microscopy (SEM) pictures. The scale bars shown in FIGS. 2(a), 2(b), and 2(c) represent 1 μm.

FIG. 2(a) shows an example of a SEM picture of an example of several complete two-probe devices after oxygen plasma etching, ALD, and local gate patterning and metal deposition. The lower left inset of FIG. 2(a) shows an example of HSQ patterned rings. The upper right inset shows an example of a top-gated bi-layer graphene Hall effect bar.

FIG. 2(b) shows an example of a SEM picture of an example of a locally gated graphene nanoconstriction.

FIG. 2(c) shows an example of a SEM picture of an example of a graphene ribbon.

FIGS. 3(a), 3(b), 3(c), and 3(d) shows an example of local gate control of electronic transport in examples of graphene nanoconstrictions.

FIG. 3(a) shows an example of conductance G in logarithmic scale vs local gate voltage $V_{LG}$ for an example of a graphene nanoconstriction. In this example, the horizontal trace is extracted from FIG. 3(b). In this example, the presence of a gap as well as sharp peaks related to charging effects is clearly visible.

FIG. 3(b) shows an example of a map of log(G) vs ($V_{LG}$, $V_{BG}$) for an example of the nanoconstriction. In this example, the diagonal blue region corresponds to the region of substantially zero conductance.

FIG. 3(c) shows an example of a stability diagram G($V_{LG}$, $V_{SD}$) at $V_{BG}$=80 V (dark blue is zero, red is $e^2$/h) for an example of the same nanoconstriction.

FIG. 3(d) shows an example of a false color SEM picture of the measured constriction showing S-D contacts (yellow) and the local gate (purple). In this example, the zoom-in illustrates schematically the presence of edge roughness in examples lithographically patterned nanoconstrictions, which can lead to the formation of quantum "dots" in series.

FIG. 5(a) shows an example of G($V_{BG}$) for an example of a graphene p-n-p junction, extracted from FIG. 5(b), showing an example of the two conductance minima associated with Dirac valleys in the graphene leads and under the local gate. The Inset shows a false color SEM picture of an example of a patterned graphene bar with contacts and local gate. In this example, the scale bar represents 1 μm.

FIG. 5(b) shows an example of a two-dimensional plot of G($V_{LG}$, $V_{BG}$) for the example of the device shown in FIG. 5(a).

FIG. 6(a) shows an example of a color map of conductance G($V_{LG}$, $V_{BG}$) at magnetic field B=13 T, and T=4.2 K. The black cross indicates the location of filling factor zero in LGR and GLs. The Inset shows an example of conductance at zero B in the same ($V_{LG}$, $V_{BG}$) range and the same color scale as the main figure (white denotes G>10.5 $e^2$/h).

FIG. 6(b) shows an example of G($V_{LG}$) extracted from FIG. 6(a). In this example, a solid line (red), showing an example of fractional values of the conductance. In this example, the numbers on the right indicate expected fractions for the various filling factors (the numbers below the trace (red) indicate the filling factor, v', in LGR); see also FIG. 6(g).

FIG. 6(c) shows an example of the conductance G($V_{LG}$). This example shows a projection of a diagonal trace (orange) from FIG. 6(a) onto the $V_{LG}$ axis. In this example, the numbers below the trace (orange) indicate filling factor, v, in the GLs.

FIGS. 6(d), 6(e), and 6(f) show examples of different edge state diagrams representing possible equilibration processes taking place at different charge densities in the GLs and LGR. In this example, the center shaded (purple) region indicates the LGR. The left and right light gray (yellow) boxes indicate contact electrodes.

FIG. 6(g) shows an example of a simulated color map of the theoretical conductance plateaus expected from the mechanisms shown in (d), (e), and (f) for different filling factors in the GLs and LGR. The numbers in the rhombi indicate the conductance at that plateau. The color scale is identical to that of (a).

FIG. 7 shows an example of two-terminal conductance of an example of a lateral heterojunction in a Quantum Hall state (see Inset) as a function of the longitudinal conductivity under local gate (LGR) for the states with v=−2 and v'=±2, ±6, −10 (shown by the horizontal trace in FIG. 6(a) and the solid line in FIG. 6(b), both shown in red). This example shows results obtained from the 2D transport model for an example of LGR of size 500 nm×700 nm. In this example, finite $\sigma_{xx}$ has considerable effect on the conductance of the state with v', v=−2, but very little effect on other states. This explains the difference in roughness of the observed plateaus for v'≠−2 and v'=−2.

FIG. 8(a) shows an example of an atomic force microscope image of examples of GNRs in a set (P3) covered by a protective HSQ etch mask.

FIG. 8(b) shows an example of a SEM image of an example of a device set P1 with parallel GNRs of varying width.

FIG. 8(c) shows an example of a SEM image of an example of a device set (D2) that includes GNRs in different relative crystallographic directions with uniform width.

FIGS. 8(d), 8(e), and 8(f) show an example of conductance of examples of GNRs in an example of a device set (P1) as a function of gate voltage measured at different temperatures. The width of each example of GNR is designated in each panel of FIGS. 8(d), 8(e), and 8(f).

DETAILED DESCRIPTION

Figure 4A:
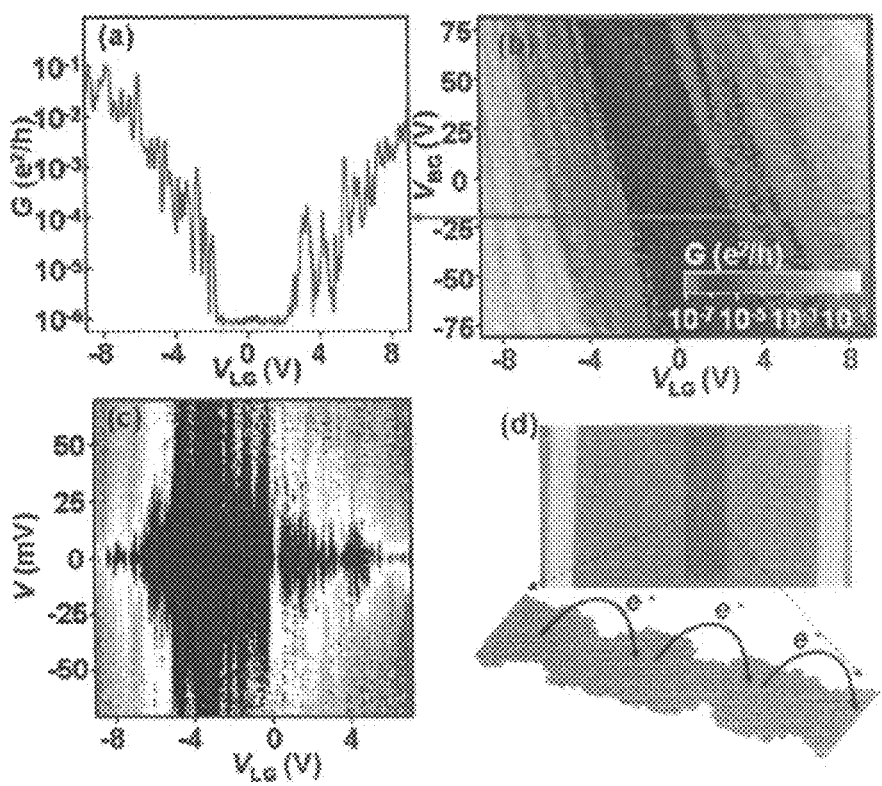
FIG. 4(a) shows an example of a SEM picture showing several complete two-probe devices with local gates. In this example, the scale bar represents 2 μm. The electrodes can contact the widest parts of the structure, in this example. The local gates can cover the graphene constrictions and part of the central graphene bars, in this example.

1. Examples of Electronic Transport in Locally Gated Electronic Nanoconstrictions Graphene constitutes a single sheet of graphite. It can be an exceptional candidate for nanoscale electronic applications. It can have charge carrier mobility as high as 20,000 $cm^2/V \cdot s$. This can allow ballistic transport, such as on the 100 nm scale, even at room temperature. Its "quasirelativistic" carrier dynamics can provide a new transport phenomena that can be used for novel device applications. The present inventors have recognized that many of these phenomena can use lithographically patterned locally-gated graphene nanostructures. Examples can include Klein tunneling, electron Veselago lens, and spin qubits. These phenomena can enable novel devices with strongly enhanced functionalities and novel operating principles.

Patterning graphene into nanostructures can be demonstrated, and interesting transport phenomena in confined graphene can be observed. A local gate controlled graphene sample can be fabricated, such as by selecting graphene flakes of random shape obtained by micromechanical extraction. In this document, we present an easy-to-user process that can pattern a graphene sheet into any desired planar nanostructure, and can provide local gating of the nanostructure. This can be used to fabricate many graphene devices, such as one or more large arrays of identical graphene devices. Such graphene devices can be formed from wafer-grown epitaxial graphene, in which a global back gate is generally absent and, therefore, local gating offers the only way to modulate the carrier density.

FIG. 1 shows an example of our sample fabrication process. In this example, first we can deposit one or more graphene flakes, such as on top of an oxidized Si substrate. This can use mechanical exfoliation. Then, the location of one or more selected flakes can be determined, such as with respect to one or more specified optical markers. Next, electric contact to the graphene flakes can be formed, such as by using electron beam lithography (EBL), in an example. In an example, an electron beam evaporation such as of Cr/Au (5/30 nm) can be followed by lift-off, such as in warm acetone (see, e.g., FIG. 1(a)). A thin layer (e.g., 20 nm) of hydrogen silsesquioxane (HSQ) solution (e.g., 1:3 HSQ:MIBK (methyl isobutyl ketone)) can then be spread. This can provide a high resolution negative tone electron-beam resist suitable for the reproducible patterning of graphene nanostructures, such as down to about 10 nm, in an example. After the resist is developed, a short oxygen plasma step (e.g., 50 W, 200 mTorr, and 6 s are enough to etch through approximately ten graphene layer) can be used to transfer the HSQ pattern into the graphene sheet (see, e.g., FIGS. 1(b) and 1(c)). In this example, HSQ can act as a protective mask, such that only the exposed graphene is etched. Without needing any further processing, we can deposit 15 nm of a high-k dielectric (e.g., hafnium oxide), such as by atomic layer deposition (ALD) directly on the samples. This approach does not require a nonconvalent functionalization layer. In this example, the HSQ etch mask can remain on top of the graphene device and can also act as an adhesion layer for the ALD-grown dielectric. Then, local metal gates (e.g., Cr/Au (5/30 nm)) can be defined, such as by using EBL (see, e.g., FIG. 1(d)). In this example, the resulting device can include a lithographically patterned graphene nanostructure sandwiched between two dielectrics, a global back gate (e.g., the highly doped Si substrate) and one or more local gates (see, e.g., FIG. 1(e)). Such a gate configuration can allow tuning of the global and local carrier densities in the graphene device, such as via the back gate voltage ($V_{BG}$) and the local gate voltage ($V_{LG}$), respectively. The conductance G of such graphene devices can be measured (e.g., at 1.7 K), as a function of $V_{BG}$ and $V_{LG}$, such as by using a lock-in technique with an ac excitation voltage of 100 μV. The number of graphene layers in our graphene devices can be determined by Raman spectroscopy or by quantum Hall effect measurements.

Using both nanometer-scaled patterning and local gate control can allow fabricating different graphene quantum devices, such as where the charge density can vary locally. FIG. 2 shows examples of such fabricated samples ranging from graphene nanorings (see, e.g., lower inset in FIG. 2(a)) and top gated bilayer graphene hall bars (see, e.g., top inset in FIG. 2(a)) to locally gated graphene nanoconstrictions (see, e.g., FIGS. 2(a) and 2(b)) and ribbons (see, e.g., FIGS. 2(1) and 2(c)). An illustrative example of a graphene nanoconstriction is shown in FIG. 2(b). In this example, the width of a graphene ribbon can be reduced from about 1 μm to a 30 nm wide nanoconstriction with a channel length of about 100 nm.

The conductance of bulk graphene samples remains finite at low temperatures even for zero carrier density. The present inventors have recognized that this can be highly undesirable for electronic devices that use an "off" state (e.g., zero conductance state), such as a semiconductor transistor or a quantum dot. The present inventors have recognized that this hurdle can be overcome, such as by engineering a graphene nanoconstriction. Without being bound by theory, due to quantum confinement in the transverse direction, graphene develops a band gap in the constriction region. Small irregularities in the constriction geometry can lead to the localization of charge in small islands, which can turn into a suppression of conductance due to Coulomb blockade. In a continuous graphene nanostructure, the latter effect will not occur without forming tunneling barriers, for which a band gap due to confinement is still involved. Therefore, without being bound by theory, in realistic samples, we expect both phenomena to take place.

FIG. 2(d) shows a typical example of such a locally gated graphene nanoconstriction. By tuning the local gate on top of this nanoconstriction, the device can be turned off substantially completely (e.g., $G<10^{-10}$), while the graphene "electrodes" that lead to the nanoconstriction remain highly conductive (e.g., $G>e^2/h$). FIG. 2(b) shows an example of a conductance map of the same device as a function of both $V_{BG}$ and $V_{LG}$. A notable feature is a diagonally oriented insulating region, representing the $(V_{BG}, V_{LG})$ range in which the device is in an "off" state. Outside this region, the conductance increases rapidly when the device is turned on. Compared to certain other nanoribbon devices, the local gate can be an order of magnitude more effective in the on-off modulation of the conductance. Without being bound by theory, this is believed due at least in part to the increased capacitive coupling, which is a consequence of the reduced dielectric thickness under the local gate. Also, the fabrication of a locally gated constriction can allow realizing a tunable tunnel barrier. Among other things, this can allow study or use of graphene quantum dots. The nanoconstriction devices can exhibit reproducible sharp peaks in conductance as $V_{LG}$ reaches the "off" regime (see, e.g., FIG. 3(a)). This can indicate the presence of charging effects. FIG. 3(c) is a stability diagram (G versus $(V_{SG}, V_{LG})$) measured for our nanoconstriction device, which can provide insight into the relative contribution of quantum confinement and Coulomb blockade effects to the suppression of conductance, G. In the example of the conductance plot of FIG. 3(c), a large central region of strongly suppressed conductance is present, along with a series of irregular, diamond shaped, and weakly conducting superimposed regions. Without being bound by theory, it is believed that these irregular "Coulomb diamonds" are characteristics of multiple quantum dots in series, which are likely to form during the etching process (see, e.g., FIG. 3(d)). A precise value of the charging energy and band gap values can be difficult to obtain without a detailed knowledge of the dot configurations. However, the relative importance of the charging effects can be estimated by the width of the second largest "diamond" with respect to the largest one. By such an estimate, it appears that the contribution of Coulomb blockade to the suppression of conductance (e.g., the ratio of charging energy to band gap due to the confinement for this particular device) is on the order of about 50%. Similar features were observed in graphene nanoribbon devices controlled by a back gate only, but were analyzed only in terms of band gap formation due to confinement. A more quantitative study of these two contributions can benefit from a device that can provide a single quantum dot, for example, such as by fabricating two smooth nanoconstrictions in series.

The above description can provide an easy-to-use approach for fabricating and locally gating lithographically patterned graphene sheets into any planar geometry. This can allow forming a graphene device that can exhibit or make use of one or more novel phenomena, such as where device operation makes use of a local variation of the carrier density. As an example, a graphene nanoconstriction can be used, such as to tune transmission by a local gate. Both quantum confinement and Coulomb blockade effects can contribute to the suppression of the conductance.

2. Examples of Electronic Transport and Quantum Hall Effect in Bipolar Graphene Junctions In an example, locally gated graphene devices can also be used or studied in the quantum Hall (QH) regime. For example, by independently varying voltage on the back gate and the local gate of a graphene nanoconstriction, we can observe bipolar QH transport such as in a graphene p-n-p heterojunction, such as in different charge density regimes. A series of fractional QH conductance plateaus can be observed as the local charge density is varied in the p and n regions. A similar QH effect can be observed in a single p-n graphene heterojunction. In an example, a double junction system can be provided, which allows study or use of one or more new interesting transport regimes, which can be absent in the QH edge transport in a single junction, such as partial equilibration of graphene QH edge states. Some of the fractionally quantized plateaus are considerably more "fragile" with respect to disorder than others. Without being bound by theory, our analysis of the distinction in the roughness of different plateaus indicates the importance of interedge backscattering in certain narrow graphene samples.

Figure 4B:
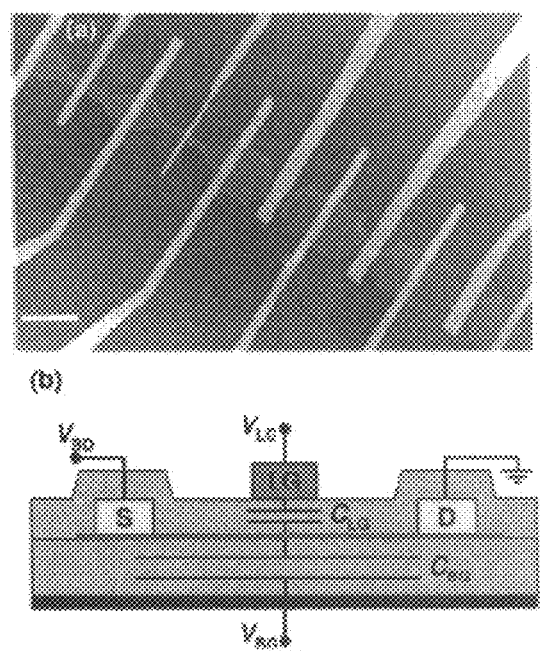
FIG. 4(b) is a schematic example showing a side view of an example of the devices. In an example, the graphene can be contacted by source (S) and drain (D) electrodes, and can be separated from the back gate plane, such as by 300 nm $SiO_2$, and from the local gate (LG) by a top dielectric (e.g., 20 nm HSQ and 15 nm $HfO_2$). In this example, the back gate (with voltage $V_{BG}$) can be coupled to the entire graphene structure via the capacitor $C_{BG}$. In an example, the local gate can be coupled to only part of the structure, such as via $C_{LG}$.

In an example, locally-gated graphene nanoconstriction devices can be fabricated, such as by using a combination of etching and dielectric deposition techniques, such as described above. FIG. 4(a) shows examples of nanostructured graphene devices after fabrication. In this example, the nanostructured devices can include a specified graphene nanostructure, which can be sandwiched between two dielectrics. A global back gate (e.g., the highly doped Si substrate) can be provided. The graphene nanostructures can be at least partially covered by one or more local gates, such as shown in the example of FIG. 4(b). Such a local gate can allow tuning of the location of the Fermi energy in graphene, such as globally (e.g., via the back gate voltage, $V_{BG}$), or locally (e.g., via the local gate voltage, $V_{LG}$). The conductance, G, of our devices can be measured, such at cryogenic temperatures (e.g., 1.5 to 4.2 K), as a function of $V_{BG}$ and $V_{LG}$, such as by using a lock-in technique with an ac excitation voltage of 100 μV. Our devices can be formed using a single graphene layer, the single layer character of which can be determined by Raman spectroscopy or quantum Hall effect measurement.

Bulk graphene is a zero band gap semiconductor. Therefore, the Fermi energy in graphene can be continuously varied, such as from valence to conduction band, such as via the electric field effect. Using a local gate allows different charge densities to be induced at different sample regions. An example of particular interest is the case when the Fermi energy in one region is in the valence band (p-type) while in the other region it is in the conduction band (n-type).

We have fabricated graphene p-n-p/n-p-n devices with different gated channel width and length (see, e.g., FIG. 4(a)). In an example, a total of six devices in two different single layer graphene pieces were studied, and were found to exhibit similar characteristics. FIG. 5(b) shows conductance, $G(V_{LG}, V_{BG})$, at zero magnetic field for a typical device in such an example. In the example of FIG. 5(b), the most prominent feature is the presence of two conductance minima valleys: one approximately horizontal, independent of the voltage $V_{LG}$, and the other diagonal. The first valley tracks the charge neutrality point (or Dirac point) in the regions outside the local gate, further denoted as graphene leads (GLs). The second valley, whose position is controlled both by the local and the back gate voltage, tracks the neutrality point in the region under the local gate (LGR). The slope of this valley is equal to the ratio of the local capacitance to the back gate capacitance. For the device shown in FIG. 5(b) this ratio is about 10.5. Note that the typical local gate breakdown voltage for our dielectric heterostructure is larger than 12 V. This, together with a tenfold enhancement of the gate coupling factor, means that we can induce local charge densities that are at least comparable, and often larger, than with the back gate (where leakage can start to occur at $V_{BG}$ of about 100 V).

Away from the Dirac valleys, the conductance increases with increasing charge density (see, e.g., FIG. 5). In this example, the two valleys separate four regions in the plot: p-p'-p, p-n'-p, n-n'-n and n-p'-n, where n (p) refers to negative (positive) charge density and the prime indicates density in the LGR. The conductance is not symmetric across the valleys, in this example, because for opposite polarities there is an extra contribution due to the resistance of the two p-n interfaces. Even in the p-n-p and n-p-n regions, the device can show considerable conductance (G>$e^2$/h) without any signature of rectifying behavior, as expected by the present inventors for transport in a zero-gap heterojunction. In fact, graphene is the only two-dimensional electron gas (2DEG) in which in-plane bipolar heterostructures p-n'-p and n-p'-n can be used or studied in the linear response regime.

The lateral graphene heterojunctions can exhibit interesting phenomena at high magnetic field. Graphene exhibits the relativistic integer quantum Hall effect. This can be manifested in a series of conductance plateaus at half-integer multiples of 4 $e^2$/h. Without being bound by theory, such a QH plateau structure can be attributed to an odd number of QH edge states that carry current with conductance 2 $e^2$/h. The present inventors have recognized that placing locally tunable electrostatic barriers or wells along the current pathway can permit the use QH mode propagation, such as to use, explore, or exploit certain intrinsic transport characteristics of a graphene heterojunction structure.

FIG. 6(a) shows an example of G($V_{LG}$, $V_{BG}$) at high magnetic field, B, for an example of our device. In addition to the four regions that can be seen at zero field (see, e.g., FIG. 6(a), inset), the conductance map reveals a rich pattern that can include rhombi and bands such as where G exhibits plateaus. Overall, this pattern can be symmetric with respect to the neutrality point (marked with a black cross) which corresponds to v=v'=0. (Here v and v' are the Landau level filling factors, equal to $n_c$e/hB with $n_c$ the carrier density in GLs and LGR, respectively.) While the plateaus in conductance at high densities |v|, |v'|≥6 can be well accounted for, such as by a two resistors-in-series model, with each resistor corresponding to the QH conductance of GLs, a more complex and interesting behavior can be observed at lower densities, where resistors cease to add up in a classical fashion.

The nonclassical behavior can be found at low filling factors, such as when either v' or v equals +2 or −2. Conductance plateaus can be observed at values close to fractional values of the conductance quantum, $e^2$/h. Such fractions can include, for example, (⅔)$e^2$/h, (6/5)$e^2$/h, and (10/9)$e^2$/h (see, e.g., FIG. 6(b)). These values are in sharp contrast to the conductance plateaus at (2, 6, 10, . . . )$e^2$/h, such as can be observed in homogenous two-terminal devices.

The unusual fractional conductance plateau patterns can be analyzed by using models developed for QH effect mode propagation in 2 DEGs with density gradients. In an example, our graphene system, however, can represent a distinct advantage, such as owing to the possibility of creating opposite polarities of charge carriers in adjacent regions.

One case to consider is when the polarity of GLs and LGR is the same (e.g., either n-n'-n or p-p'-p), and the LGR density is lower than the GLs' density: |v'|≤|v|. In this case, such as shown in the example of FIG. 6(d), the number of QH edge modes is larger in the GLs than in the LGR. The modes existing only in the GLs are fully reflected at the LGR-GLs interfaces, while those present in both regions exhibit full transmission, giving rise to the net conductance G=($e^2$/h)|v|.

An interesting situation occurs when the LGR density is higher than the GLs' density, with the LGR and GLs' polarities still the same. In this case the number of edge states is smaller in the GLs than in the LGR (see, e.g., FIG. 6(e)). The states circulating in LGR can produce partial equilibration among the different channels, because they couple modes with different electrochemical potentials. To analyze this regime, one can suppose that current I is injected from the left lead, while no current is injected from the right lead. Then, the conservation of current yields I+$I_4$=$I_1$, $I_2$=$I_3$ (the LGR edges can be labeled by 1, 2, 3, 4, such as shown in the example of FIG. 6(e)). Assuming that the current at the upper and lower LGR edges is partitioned equally among available edge modes, we can obtain the relations for the current flowing out of these edges: $I_2$=r$I_1$, $I_4$=r$I_3$, (r=1=v/v'). Solving these equations for $I_{1...4}$, we can determine the current flowing in the drain lead as $I_{out}$=$I_1$−$I_2$ and find the net conductance $$G = \frac{e^2|v'||v|}{h2|v'|-|v|} = \frac{6}{5}, \frac{10}{9}, \frac{30}{7}, \ldots \; (|v'| \geq |v|) \qquad (1)$$

where v=v'=±2, ±6. Without being bound by theory, we believe that this partial equilibration regime can only occur in the presence of two n-n' or p-p' interfaces, and would not occur in a single n-n' or p-p' junction.

Another case is when the GLs and LGR have opposite carrier polarity. In this case, the edge states can counter-circulate in the p and n areas, running parallel to each other along the p-n interface (see, e.g., FIG. 6(f)). Such propagation, which can lead to mixing among edge states, can result in full equilibration at the p-n interfaces: $I_1$=r$I_2$, $I_3$=r$I_4$, (r=|v'|/(|v|+|v'|)). Combining this with current conservation, in this case written as I+$I_1$=$I_4$, $I_2$=$I_3$, we find the currents and obtain the conductance $$G = \frac{e^2|v'||v|}{h2|v'|+|v|} = \frac{2}{3}, \frac{6}{5}, \frac{6}{7} \ldots \; (vv' < 0), \qquad (2)$$

where v, v'=±2, ±6 . . . . The net conductance in this case can be described by three quantum resistors in series.

The conductance values for these three regimes can be shown as a color map, such as in the example of FIG. 6(g). In this example, the structure of the experimental pattern resembles qualitatively the theoretical one when the filling factor equals ±2 either in the GLs or in the LGR. For a quantitative analysis, one can choose two cuts extracted from FIG. 6(a), showing conductance for fixed v=−2 (see, e.g., FIG. 6(b)) and v'=2 (FIG. 6(c)). Reasonably good plateaus can be recorded at G=(⅔)$e^2$/h, G=(10/9)$e^2$/h, as well as at other fractions, such as discussed above. In this example, the only exception is of a considerably poorer plateau with G=2 $e^2$/h. FIG. 6(b) represents nonmonotonic conductance behavior for v'=2, −2, −6, −10 (with v=2), which reflects the full equilibration→edge state transmission→partial equilibration sequence. This is in contrast to the monotonic behavior of G in the example of FIG. 6(c) for v=−2→2→6 (with v'=2), where only the full equilibration and full transmission regimes are expected.

In an example, we have measured four devices, which all exhibit similar conductance patterns. In none of these devices did G reach the full 2 $e^2/h$ value at v', v=±2, whereas other conductance plateaus were well developed. Without being bound by theory, the lack of quantization can indicate the presence of backscattering between opposite edges of our sample, which may occur in LGR bulk or in the transitional regions at the LGR-GLs junctions.

The v', v=±2, plateaus are sensitive to backscattering, while other plateaus are not. To gain insight, one can investigate how robust the results (1) and (2) are with respect to bulk conduction in our QH system. To that end, one can consider a 2D transport model describing the system by local conductivity. Here, one can focus on a simplified situation, taking the longitudinal conductivity $\sigma_{xx}$ nonzero in the gated region (LGR) and zero outside (GLs), and the Hall conductivity $\sigma_{xx}$ equal to v'$e^2/h$ (v$e^2/h$) for LGR (GLs).

An exact solution for 2D current and potential distribution for this problem can be obtained by using conformal mapping. The resulting two-terminal conductance G of the fractionally quantized states from the v=−2 trace (see, e.g., FIG. 6(b)) are displayed in the example of FIG. 7. The limiting values of G at $\sigma_{xx} \to 0$ agree with the simple fractions (1) and (2) derived above. Furthermore, the effect of finite $\sigma_{xx}$ can be considerably stronger for the v=v'=−2 state than for all other states; it is linear rather than quadratic at small $\sigma_{xx}$. Comparing it to the deviation from the quantized value in FIG. 6, one can estimate $\sigma_{xx} < 0.5$ $e^2/h$.

Without being bound by theory, one can infer that weak backscattering is nondetrimental for all the states except v=v', which agrees with the observed stability of fractional plateaus. This conclusion also agrees with the general intuition that current paths in a QH system can be constrained more strongly when density is varying in space than when it is constant. Without being bound by theory, it is believed that our understanding of the stability of the observed fractional plateaus is quite generic and insensitive to whether the backscattering in our graphene devices occurs mainly in LGR bulk or at the LGR-GLs interfaces.

3. Examples of Energy Bandgap Engineering of Graphene Nanoribbons

The present inventors have also recognized, among other things, that when graphene is patterned into a narrow ribbon, and the carriers are confined to a quasi-one-dimensional (1D) system, the opening of an energy gap can be present. The present inventors have also recognized that this energy gap can depend on the width and crystallographic orientation of the graphene nanoribbon (GNR).

In this document, we present electronic transport measurements of lithographically patterned GNR structures, such as in which the lateral confinement of charge carriers creates an energy gap. In an example, more than two dozen GNRs of different widths and crystallographic orientations were measured. The present inventors have found, among other things, that the energy gap depends strongly on the width of the channel for GNRs in the same crystallographic direction, but no systematic crystallographic dependence was observed.

In an example, the GNR devices can be fabricated from one or more single sheets of graphene, such as which can be mechanically extracted from bulk graphite crystals onto a $SiO_2$/Si substrate. In an example, graphene sheets with lateral sizes of about 20 μm can be contacted, such as with Cr/Au (e.g., 3/50 nm) metal electrodes. In an example, negative tone e-beam resist (e.g., hydrogen silsesquioxane (HSQ)), can then be spun onto the samples and patterned, such as to form an etch mask defining one or more graphene nanoribbons, such as with widths ranging from about 10 nm to about 100 nm, and lengths of about 1 μm to about 2 μm. In an example, an oxygen plasma can be introduced, such as to etch away the unprotected graphene. This can leave the GNR protected beneath the HSQ mask (see, e.g., FIG. 8(a)).

In an example, we can study two different types of device sets: device sets P1-P4 each contain many ribbons of varying width running parallel (see, e.g., FIG. 8(b)), and a device sets D1 and D2 have ribbons of uniform width and varying relative orientation (see, e.g., FIG. 8(c)). In either case, a device within a given set is etched from the same sheet of graphene, so that the relative orientation of the GNRs within a given set is determined.

In an example, each GNR can connect two blocks of wider (e.g., about 0.5 μm) graphene, which, in turn, can be contacted, such as by one or more metal or other electrodes. Unlike CNTs, Schottky barrier formation by the metal electrodes is absent in an example of our GNR devices. Furthermore, multiple contacts on the wider block of graphene can allow for four-terminal measurements, such as to substantially eliminate the residual contact resistance (e.g., about 1 kΩ). A heavily doped silicon substrate below the 300 nm thick $SiO_2$ dielectric layer can serve as a gate electrode, such as to tune the carrier density in the GNR. In an example, the width (W) and the length of each GNR were measured using a scanning electron microscope (SEM) after the transport measurements were performed. Since, in an example, the HSQ protective layer was not removed from the GNR for this imaging, this measurement can provide an upper bound to the true width of the GNR.

In an example, the conductance, G, of the GNRs was measured using a lock-in technique with a small applied ac voltage (e.g., <100 μV at 8 Hz). FIGS. 8(d)-8(f) show an example of the measured G of three representative GNR devices of varying width (e.g., W=24±4, 49±5, and 71±6 nm) and uniform length (e.g., L=2 μm) as a function of gate voltage $V_g$ at different temperatures. In this example, all curves can exhibit a region of depressed G with respect to $V_g$. In "bulk" (e.g., unpatterned) graphene, this dip in G corresponds to the minimum conductivity ~4$e^2/h$ at the charge neutrality point, $V_g = V_{Dirac}$, where e and h are the electric charge and Planck constant, respectively. At room temperature, our GNRs can exhibit qualitatively similar G($V_g$) behaviors, such as showing a minimum conductance $G_{min}$ on the order of 4$e^2$/h(W/L).

The present inventors have recognized, among other things, that, unlike the bulk case, GNRs with width W<100 nm can show a decrease in $G_{min}$ of more than an order of magnitude at low temperatures. The narrowest GNRs exhibit the greatest suppression of $G_{min}$, making such a structure useful for a device in which an "off" state is needed, such as at room temperature. For example, for the GNR with W=24±4 nm (see, e.g., FIG. 8(d)), a large "gap" region appears for 25<$V_g$<45 V, where $G_{min}$ is below our detection limits (<$10^{-8}\Omega^{-1}$). The strong temperature dependence of G($V_g$) in GNRs is in sharp contrast to that of the "bulk" graphene samples, in which $G_{min}$ changes less than 30% over the temperature range from about 30 mK to about 300 K. The suppression of G near the charge neutrality point leads us toward the opening of an energy gap. We observe (see, e.g., FIG. 8(d)-8(f)] stronger temperature dependence of G for a broader range of $V_g$ values in narrower GNRs, leading us toward larger energy gaps in narrower GNRs.

Figure 9:
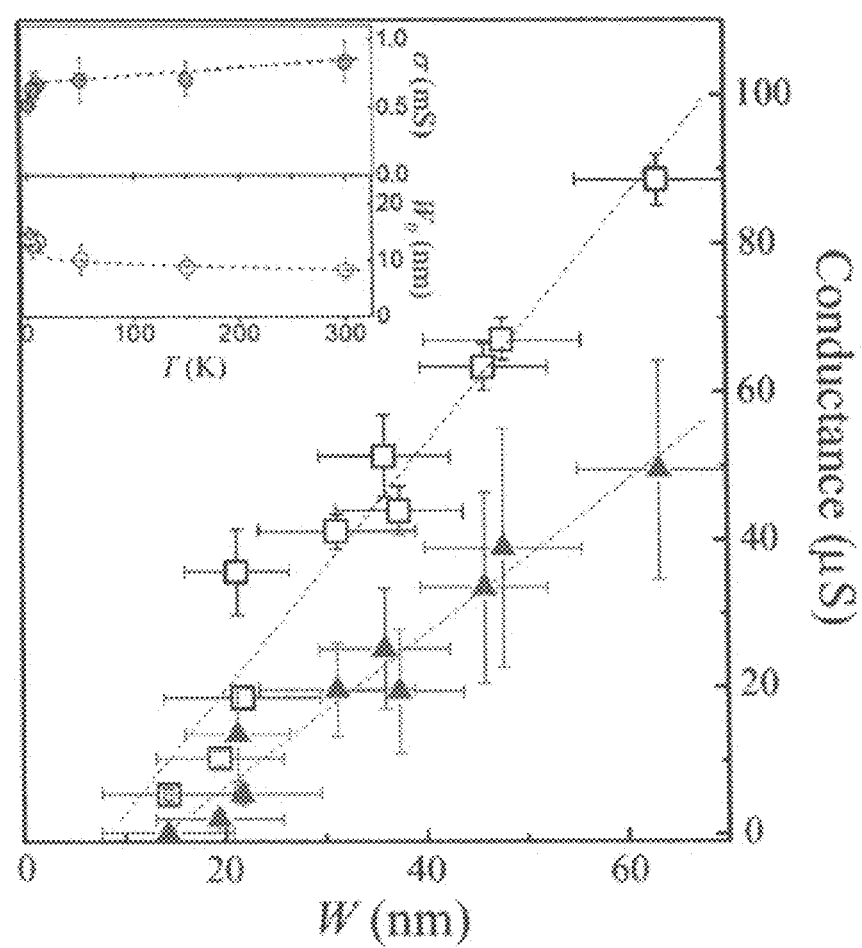
FIG. 9 shows an example of conductance vs. width of an example of parallel GNRs (set P4) measured at $V_g-V_{Dirac}=-50$ V at three representative temperatures. In this example, the square and triangle symbols correspond to T=300, and 1.6 K, respectively. The dashed lines represent the linear fits at each temperature. The insets show examples of the conductivity (upper) and the inactive GNR width (lower) obtained from the slope and x-intercept of the linear fit at varying temperatures. In this example, the dashed curves are shown in the insets as a guide to the eye.

The present inventors have also recognized that, outside of the "gap" region near the Dirac point, the conductance scales with the width of the GNR. FIG. 9 shows an example of the conductance of a set of parallel GNRs, with widths ranging from about 14 nm to about 63 nm, measured at two temperatures, T=1.6 and 300 K. In this example, the gate voltage is fixed at $V_g=V_{Dirac}-50$ V, which corresponds to a hole carrier density of about $n=3.6\times10^{12}$ cm$^{-2}$. The conductance can be well described by the linear fit $G=\sigma(W-W_0)/L$ (shown by a dashed line). Here $\sigma$ and $W-W_0$ can be interpreted as the GNR sheet conductivity and the active GNR width participating in charge transport, respectively. In an example, the sheet conductivity is about 1.7 mS and decreases with decreasing temperature, reaching about 75% of the room temperature value at T=1.6 K. The inactive GNR width $W_0$ increases from 10 nm at room temperature to 14 nm at 1.6 K. A reduced active channel width can be obtained in GNRs fabricated on epitaxial multilayer graphene films, in which much larger inactive edges (e.g., $W_0$ of about 50 nm) can be estimated than for our present GNR samples. There can be at least two possible explanations for the finite $W_0$ measured in our experiment with our present GNR samples: (i) contribution from localized edge states near the GNR edges due to structural disorder caused by the etching process and (ii) inaccurate width determination due to over-etching underneath the HSQ etch mask. To investigate this, we removed the HSQ etch mask from several GNRs and found that the actual GNR is often about 10 nm narrower than the HSQ protective mask. This suggests that the inactive region due to the localized edge states can be small (e.g., <2 nm) at room temperature and can spread to as much as about 5 nm at low temperatures.

Figures 10A, 10B, 10C, 10D, 10E:
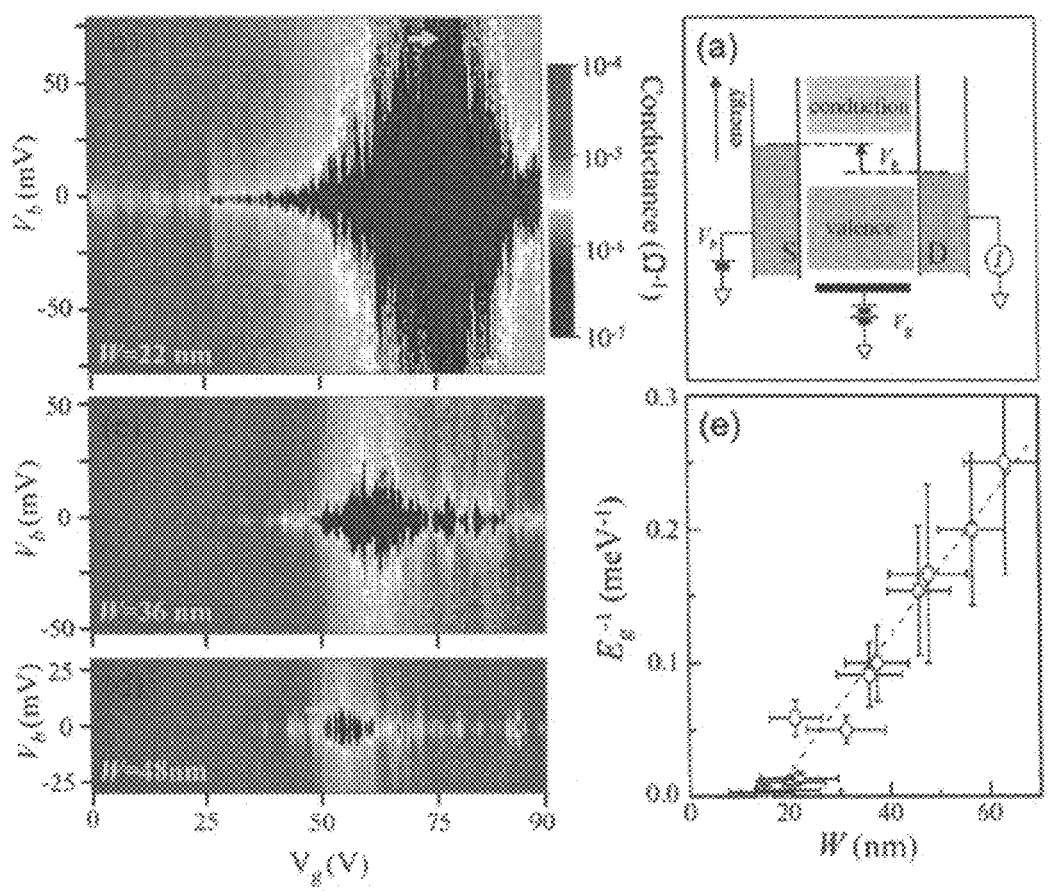
FIG. 10(a) shows an example of a schematic energy band diagram of an example of a GNR with bias voltage $V_b$ applied. In this example, the current I can be controlled by both source-drain bias $V_b$ and gate voltage $V_g$.
FIGS. 10(b), 10(c), and 10(d) show examples of the differential conductance ($dI/dV_b$) of three representative GNRs from set P4 with W=22, 36, and 48 nm, respectively, as a function of $V_b$ and $V_g$ measured at T=1.6 K. In this example, the light (dark) color indicates high (low) conductance, such as designated by the color map. In this example, the horizontal arrows represent $V_b=E_{gap}=e$.
FIG. 10(e) shows an example of $E_{gap}^{-1}$ vs. W obtained from similar analysis as FIGS. 10(b), 10(c), and 10(d), with a linear fit of the data.

The present inventors have recognized, among other things, that quantitative techniques can be used for scaling of the energy gap as a function of GNR width, and that such scaling can be particularly useful in combination with local gating of a GNR device. For example, by examining the differential conductance in the nonlinear response regime as a function of both the local gate and bias voltage, we can directly measure the size of the energy gap. FIG. 10(a) shows an example of a schematic energy band diagram for a GNR with source and drain electrodes. As the bias voltage, $V_b$, increases, the source and drain levels approach the conduction and valence band edges, respectively. When conduction (valence) band edge falls into the bias window between the source and drain electrodes, electrons (holes) are injected from source (drain) and the current Irises sharply. The gate voltage adjusts the position of the gap relative to the source-drain levels. FIGS. 10(b)-10(d) shows an example of the conductance versus $V_g$ and $V_b$ for three representative GNR devices of different width measured at T=1.6 K. The color indicates conductivity on a logarithmic scale, with the large dark area in each graph representing the turned-off region in the $V_g$-$V_b$ plane where the both band edges are outside of the bias windows. The diamond shape of this region indicates that both $V_b$ and $V_g$ adjust the position of the band edges relative to the source and drain energy levels, which can be compared to nonlinear transport in quantum dots. As designated by the arrows, the GNR band gap $E_{gap}$ can be directly obtained from the value of $V_b$ such as at the vertex of the diamond.

To obtain the quantitative scaling of $E_{gap}$ with respect to W, $E_{gap}^{-1}$ can be plotted against W such as shown in FIG. 10(e) for a set of 13 parallel GNRs. The dashed line indicates a linear fit to the data, corresponding to $E_{gap}=\alpha/(W-W^*)$, with $\alpha=0.2$ eVnm and $W^*=16$ nm obtained from the fit. The energy gap of a GNR can scale inversely with the channel width, such as with a corresponding $\alpha$ value ranging between 0.2-1.5 eVnm, and $W\approx W_0$.

Figure 11:
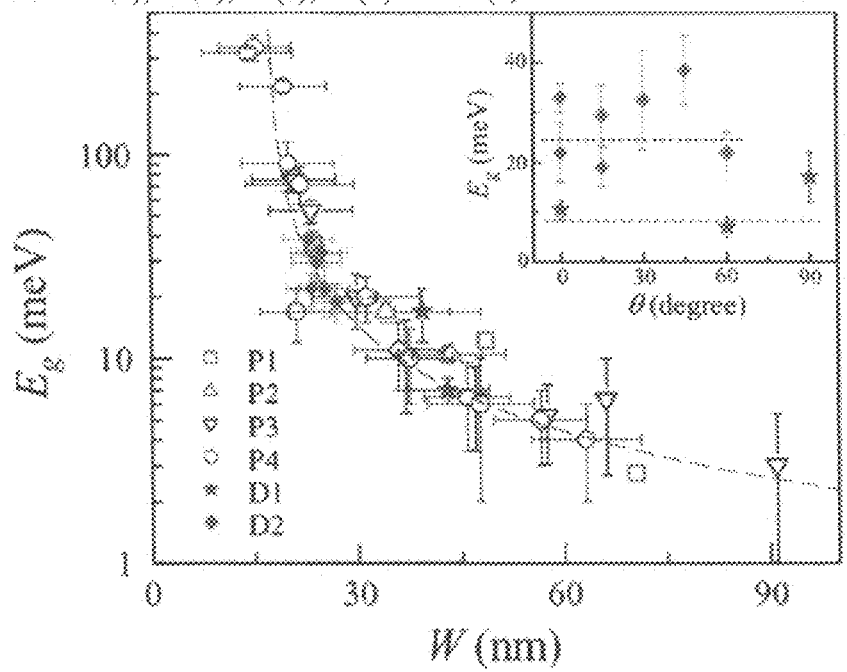
FIG. 11 shows an example of $E_{gap}$ vs. W for an example of six device sets considered in this study: four (P1-P4) of the parallel type and two (D1, D2) with varying orientation. In this example, the inset shows $E_{gap}$ vs. relative angle θ for the device sets D1 and D2. In this example, dashed lines in the inset show the value of $E_{gap}$ as predicted by the empirical scaling of $E_{gap}$ vs W.

The present inventors have also recognized that a similar scaling behavior holds even across GNR device sets running in different crystallographic directions. FIG. 11 shows an example of the overall scaling of $E_{gap}$ as a function of W for six different device sets. In this example, four device sets (P1-P4) have parallel GNRs with W ranging from 15-90 nm, and two device sets (D1, D2) have GNRs with similar W but different crystallographic directions. The energy gap behavior of all devices is well described by the scaling $E_{gap}=\alpha/(W-W^*)$ as discussed above, indicated by the dashed line. Remarkably, energy gaps as high as about 200 meV can be achieved, such as by engineering GNRs as narrow as W of about 15 nm. Based on the empirical scaling determined here, an even narrower GNR may show an even larger band gap, making the use of GNRs for semiconducting device components in ambient conditions possible.

We also experimented to observe the crystallographic directional dependence of $E_{gap}$. The inset to FIG. 11 shows $E_{gap}$ versus the relative orientation angle $\theta$ for two sets of GNRs. In principle, we expect $E_{gap}(\theta)$ for each set to be periodic in $\theta$, provided all GNRs in the set have similar edge structures. However, experimental observation shows randomly scattered values around the average $E_{gap}$ corresponding to W, with no sign of crystallographic directional dependence. This leads us to believe that the detailed edge structure plays a more important role than the overall crystallographic direction in determining the properties of the GNRs. Indeed, theory for an ideal GNR can predict that $E_{gap}$ depends sensitively on the boundary conditions at the edges. The lack of directional dependence can indicate that, in an example, our device fabrication process does not yield the atomically precise control of the GNR edges that would reveal this effect.

We demonstrated that the energy gap in patterned graphene nanoribbons can be tuned during fabrication with the appropriate choice of ribbon width. An understanding of ribbon dimension and orientation as control parameters for the electrical properties of graphene structures can be useful for forming graphene-based electronic devices, particularly when used in combination with local gating, such as described above.

Additional Notes

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown and described. However, the present inventors also contemplate examples in which only those elements shown and described are provided.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code may be tangibly stored on one or more volatile or non-volatile computer-readable media during execution or at other times. These computer-readable media may include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. An electronic device comprising:
    a graphene layer comprising first and second terminal regions separated by a substantially single layer gated graphene nanoconstriction;
    a local first gate region, separated from the graphene nanoconstriction by a first gate dielectric, the local first gate region configured to be capacitively coupled to gate electrical conduction in the graphene nanoconstriction;
    a transistor, including the first and second terminal regions and the local first gate region, the first gate dielectric including a first layer of hydrogen silsesquioxane (HSQ) and a second layer including a dielectric material grown directly on the first layer by atomic layer deposition; and
    a second gate region, separated from the graphene nanoconstriction by a second gate dielectric, the second gate region configured to be capacitively coupled to provide a bias to a first location in the graphene nanoconstriction and to a second location outside of the graphene nanoconstriction.

2. The device of claim 1, wherein the graphene nanoconstriction comprises a gated channel length between the first and second terminal regions, and defines a gated channel width substantially orthogonal to the channel length, and wherein the channel width is less than 100 nanometers.

3. The device of claim 2, wherein the channel width is less than 30 nanometers.

4. The device of claim 1, wherein the graphene nanoconstriction comprises a gated channel length between the first and second terminal regions, and defines a gated channel width substantially orthogonal to the channel length, and wherein the channel width is selected to provide an energy bandgap in the graphene nanoconstriction of at least 2 meV.

5. The device of claim 4, wherein the channel width is selected to provide an energy bandgap in the graphene nanoconstriction of at least 10 meV.

6. The device of claim 1, wherein the graphene nanoconstriction comprises a gated channel length between the first and second terminal regions, and defines a gated channel width substantially orthogonal to the channel length, and wherein the channel width is selected to provide a change of conductance of at least about $10^3 \cdot e^2/h$, in response to a change in gate voltage between the local first gate region and the second gate region of about 4 Volts.

7. The device of claim 1, wherein the second layer comprises a dielectric material having a dielectric constant $k \geq 20$.

8. The device of claim 7, wherein the second gate region comprises a silicon substrate providing a global back gate for the graphene layer, and wherein the second gate dielectric comprises silicon dioxide.

9. The device of claim 1, wherein the local first gate region provides a local first capacitance to the graphene nanoconstriction, and wherein the second gate region provides a second capacitance to the graphene nanoconstriction, and wherein a ratio of the local first capacitance to the second capacitance is about 10.5.

10. A method comprising:
    capacitively coupling a bias voltage to a graphene layer, the graphene layer comprising first and second terminal regions separated by a substantially single layer graphene nanoconstriction; and
    locally gating the graphene nanoconstriction to locally control electrical conduction between the first and second terminal regions, comprising:
        forming a local first gate region separated from the graphene nanoconstriction by a first gate dielectric, the first gate dielectric including a first layer of hydrogen silsesquioxane (HSQ) and a second layer including a dielectric material grown directly on the first layer by atomic layer deposition.

11. The method of claim 10, wherein the locally gating the graphene nanoconstriction comprises locally gating the graphene nanoconstriction having a gated channel width that is less than 100 nanometers.

12. The method of claim 11, wherein the locally gating the graphene nanoconstriction comprises locally gating the graphene nanoconstriction having a gated channel width that is less than 30 nanometers.

13. The method of claim 10, wherein the locally gating the graphene nanoconstriction comprises locally gating the graphene nanoconstriction having an energy bandgap in the graphene nanoconstriction of at least 2 meV.

14. The method of claim 13, wherein the locally gating the graphene nanoconstriction comprises locally gating the graphene nanoconstriction having an energy bandgap in the graphene nanoconstriction of at least 10 meV.

15. The method of claim 10, wherein the locally gating the graphene nanoconstriction comprises locally gating the graphene nanoconstriction to provide a gate-controlled p-n junction between the first and second terminal regions.

16. The method of claim 10, wherein the locally gating the graphene nanoconstriction comprises locally gating the graphene nanoconstriction to provide a change of conductance of about $10^3 \cdot e^2/h$, in response to a change in gate voltage of about 4 Volts.

17. The method of claim 10, wherein the locally gating the graphene nanoconstriction comprises locally capacitively coupling using a local capacitance that is about 10.5 times a capacitance used for capacitively coupling the bias voltage to the graphene layer.

18. A method comprising:
forming a substantially single layer graphene layer;
forming a graphene nanoconstriction in the substantially single layer graphene layer;
forming a local first gate that is locally capacitively coupled to the graphene nanoconstriction;
forming a first dielectric between the local first gate and the graphene nanoconstriction, including:
forming a first layer of hydrogen silsesquioxane (HSQ); and
forming a second layer of dielectric material by atomic deposition directly on the first layer; and
forming a second gate that is capacitively coupled to the graphene layer so as to be capable of providing a bias to a first location in the graphene nanoconstriction and to a second location outside of the graphene nanoconstriction.

19. The method of claim 18, wherein forming the graphene nanoconstriction in the substantially single layer graphene layer comprises defining a channel width that is less than 100 nanometers.

20. The method of claim 19, wherein forming the graphene nanoconstriction in the substantially single layer graphene layer comprises defining a channel width that is less than 30 nanometers.

21. The method of claim 18, wherein forming the graphene nanoconstriction in the substantially single layer graphene layer comprises defining a channel width that provides an energy bandgap in the graphene nanoconstriction of at least 2 meV.

22. The method of claim 21, wherein forming the graphene nanoconstriction in the substantially single layer graphene layer comprises defining a channel width that provides an energy bandgap in the graphene nanoconstriction of at least 10 meV.

23. The method of claim 18, wherein forming the graphene nanoconstriction in the substantially single layer graphene layer comprises defining a channel width such that the graphene nanoconstriction is capable of providing a change of conductance of about $10^3 \cdot e^2/h$, in response to a change in gate voltage of about 4 Volts.

24. The method of claim 18, wherein
forming the second layer comprises forming a dielectric material having a dielectric constant $k \geq 20$.

25. The method of claim 18, comprising:
forming a silicon oxide layer on a silicon substrate;
providing the graphene layer on the silicon oxide layer;
selectively removing portions of the HSQ layer and corresponding portions of the underlying graphene layer to define the graphene nanoconstriction; and
forming a gate region on the second layer of dielectric material.

* * * * *